United States Patent
Mayuzumi

(10) Patent No.: US 6,316,836 B1
(45) Date of Patent: Nov. 13, 2001

(54) SEMICONDUCTOR DEVICE INTERCONNECTION STRUCTURE

(75) Inventor: Satoru Mayuzumi, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/320,493

(22) Filed: May 26, 1999

(30) Foreign Application Priority Data

May 27, 1998 (JP) .................................................. 10-145426

(51) Int. Cl.[7] .................................................. H01L 23/535
(52) U.S. Cl. .......................... 257/775; 257/773; 257/774; 257/758
(58) Field of Search ................................... 257/774, 775, 257/776, 750, 758, 773

(56) References Cited

U.S. PATENT DOCUMENTS

| | | | | |
|---|---|---|---|---|
| 4,916,521 | * | 4/1990 | Yoshikawa et al. | 357/71 |
| 5,404,046 | * | 4/1995 | Matsumoto et al. | 257/750 |
| 5,612,574 | * | 3/1997 | Summerfelt et al. | 257/783 |
| 5,616,959 | * | 4/1997 | Jeng | 257/758 |
| 5,616,961 | * | 4/1997 | Kohyama | 257/774 |
| 5,717,240 | * | 2/1998 | Kuriyama et al. | 257/370 |
| 5,739,587 | * | 4/1998 | Sato | 257/758 |
| 5,808,365 | * | 9/1998 | Mori | 257/775 |
| 5,828,121 | * | 10/1998 | Lur et al. | 257/522 |
| 5,838,032 | * | 11/1998 | Ting | 257/211 |
| 5,898,215 | * | 4/1999 | Miller et al. | 257/679 |
| 5,905,307 | * | 5/1999 | Onoda | 257/775 |
| 5,932,929 | * | 8/1999 | Lui et al. | 257/763 |
| 5,936,308 | * | 8/1999 | Rolfson | 257/774 |
| 5,945,709 | * | 8/1999 | Williams et al. | 257/343 |
| 5,962,867 | * | 10/1999 | Liu | 257/48 |
| 6,040,604 | * | 3/2000 | Lauvray et al. | 257/355 |
| 6,100,592 | * | 8/2000 | Pan | 257/774 |

FOREIGN PATENT DOCUMENTS

| | | | |
|---|---|---|---|
| 2-183536 | 7/1990 | (JP) | H01L/21/3205 |
| 8335634 | 12/1996 | (JP) | H01L/21/768 |
| 917868 | 1/1997 | (JP) | H01L/21/768 |
| 9-45767 | 2/1997 | (JP) | H01L/21/768 |
| 11-54618 | 2/1999 | (JP) | H01L/21/768 |
| 58-191449 | 11/1983 | (JP) | H01L/21/88 |
| 63-143845 | 6/1988 | (JP) | H01L/21/90 |
| 3-141661 | 6/1991 | (JP) | H01L/21/90 |
| 4348547 | 12/1992 | (JP) | H01L/21/90 |

* cited by examiner

*Primary Examiner*—Eddie Lee
*Assistant Examiner*—Lourdes Cruz
(74) *Attorney, Agent, or Firm*—Hayes, Soloway, Hennesey, Grossman & Hage, P.C.

(57) ABSTRACT

A semiconductor device in which an aperture of a via hole is partially overlapped with a first layer conductor, its aperture width is larger than a first layer conductor width, and the via plug is entirely covered with a second layer conductor. According to this semiconductor device, an increase of and a scattering of contact resistance between the conductors can be reduced by making the aperture area of the via hole larger.

6 Claims, 10 Drawing Sheets

SEMICONDUCTOR DEVICE INTERCONNECTION STRUCTURE

BACKGROUND OF THE INVENTION (a) Field of the Invention

The present invention relates to an interconnection structure between conductors in a semiconductor device for effectively reducing contact resistance between the conductors in the interconnection structure.

(b) Description of the Related Art

In a conventional semiconductor device having various conductors overlying a semiconductor substrate, a via hole is generally formed penetrating through a dielectric film for electrically connecting a plurality of conductive layers together.

Examples of an interconnection structure between conductive layers in a conventional semiconductor device are shown in FIGS. 1A, 1B, 2A and 2B. FIG. 1A is a top plan view of an interconnection structure and FIG. 1B is a sectional view of the structure of FIG. 1A taken along a line A—A. Similarly, FIG. 2A is a top plan view of another interconnection structure and FIG. 2B is a sectional view of the structure of FIG. 2A taken along a line A—A.

As shown in FIG. 1B, a silicon oxide film 16 is formed on a semiconductor substrate 17 and first layer conductors 11 are formed on the silicon oxide film 16. A dielectric film 12 is then formed on the first layer conductors 11. After the dielectric film 12 is flattened by employing a chemical mechanical polishing (CMP) technique, a via hole 18 is formed in the dielectric film 12 for connecting the first layer conductors 11 and second layer conductor 15. The aperture size of the via hole 18 is made smaller than the area formed by overlap between the first layer conductor and the second layer conductor 11,15 as shown in FIG. 1A in order to secure the interconnection therebetween, The whole surface of the dielectric film 12 including the via hole 18 is coated with a conductive material 14 by employing a chemical vapor deposition (CVD) technique, and the top surface of the conductive material 14 is aligned with the top surface of the dielectric film 12 by employing a dry etching technique to fill the via hole 18 with the conductive material 14 to make the via plug. After this procedure, the second layer conductor 15 is formed on the via plug 18.

As shown in FIG. 2B, a silicon oxide film 26 is formed on a semiconductor substrate 27 and two first layer conductors 21 are separately formed on the silicon oxide film 26. A dielectric film 22 is then formed on the first layer conductors 21 and on the silicon oxide film 26. Via holes 28 are formed smaller than an area formed by overlap between the first layer conductor 21 and a second layer conductor 25. The via holes 28 are filled with a conductive material 24 and the second layer conductor 25 is formed on the via plugs 28 and the dielectric film 22.

The width of conductors is generally made smaller and smaller in order to decrease the parasitic capacitance of the conductors for responding to a recent demand of high operational speed. Since the above decrease makes, an area formed by overlap between the first layer conductor and the second layer conductor smaller to reduce the aperture area, a contact resistance between the first layer conductor and the conductive material filled in the via hole increases. When a barrier metal layer is formed in the via hole by means of sputtering, a thickness of the barrier metal layer, at the bottom of the via hole is thinner than desired because the aperture area of the via hole is small so that the scattering of the contact resistance between the barrier metal layer in the via plug and the first layer conductor becomes larger. Since, further, the via hole is smaller than an area formed by overlapping between the first and the second layer conductors, the high accuracy of position adjustment between a mask for forming the via hole and the first layer conductor is required.

In order to solve this problem, a structure shown in FIGS. 3A to 3C is proposed (JP-A-09(1997)-17868). FIG. 3A is a top plan view of the structure, and FIGS. 3B and 3C, are sectional views taken along the lines A—A and B—B, respectively, of FIG. 3A.

As shown in FIG. 3B, a silicon oxide film 36 is formed on a semiconductor substrate 37 and a first layer conductor 31 is formed on the central part of the silicon oxide film 36. A dielectric film 32 is then formed on the first layer conductor 31 and on the silicon oxide film 36. A via hole 39 is formed in the dielectric film 32 for connecting the first layer conductor 31 and a second layer conductor 35. This via hole 39 is made larger than an area formed by overlapping between the first and the second layer conductors 31, 35 as shown in FIG. 3A. The second layer conductor 35 is so formed that it is in contact with the first layer conductor 31 through the via hole 39.

However, in this interconnection structure between the conductors, an unnecessary trench is formed between the dielectric film 32 and the second layer conductor 35 as shown in FIG. 3C so that coverage of the upper layers becomes worse. When two or more first layer conductors are present as shown in FIG. 2B, the same number of via holes as that of the first layer conductors are required. If the via hole shown in FIG. 3B is formed in FIG. 2B, further unnecessary trenches are produced.

SUMMARY OF THE INVENTION

It is therefore an object of the present invention to provide a semiconductor device having an interconnection structure for preventing an increase of or a scattering of a contact resistance between conductors connected through a via hole formed in a dielectric film.

Another object of the present invention is to provide a semiconductor device having an interconnection structure which moderates an accuracy of position adjustment at the time of via hole formation.

A further object of the present invention is to provide a semiconductor device having an interconnection structure which eliminates unnecessary trenches generated in the via hole.

A still further object of the present invention is to provide a semiconductor device having an interconnection structure which elevates a coverage of upper layers.

The present invention provides a semiconductor device comprising: a substrate, a first dielectric film overlying said substrate, a first layer conductor formed on said first dielectric film, a second dielectric film formed on said first dielectric film and on said first layer conductor, a second layer conductor formed on said second dielectric film, said first layer conductor and said second layer conductor being electrically connected through at least one via hole formed in said second dielectric film, said via hole having a width larger than that of the first layer conductor and not larger than that of the second layer conductor, said via plug being entirely covered with said second layer conductor.

In accordance with the present invention, an increase of and a scattering of contact resistance between a first (lower)

layer conductor and a second (upper) layer conductor in an interconnection structure in a semiconductor device can be reduced by making an aperture area of a via hole larger. Further, an accuracy of position adjustment between a mask for forming a via hole and the first layer conductor may be moderated. Since an unnecessary difference in level can be eliminated by covering the via plug by means of the upper layer conductor, step coverage of the upper layer conductor is increased. Moreover, the scattering of the contact resistance between the upper and the lower layer conductors can be further reduced by connecting a plurality of the lower layer conductors with the upper layer conductor through a single via hole.

The above and other objects, features and advantages of the present invention will be more apparent from the following description referring to the accompanying drawings.

BRIEF DESCRIPTION OF DRAWINGS

FIG. 1 shows an example of an interconnection structure between conductors of a conventional semiconductor device, wherein

FIG. 2 shows another example thereof, wherein

FIG. 3 shows a further example thereof, wherein

FIG. 4 shows an embodiment of a semiconductor device in accordance with the present invention, wherein

FIG. 5 shows another embodiment of a semiconductor device, wherein

FIG. 6 shows a further embodiment of a semiconductor device, wherein

FIG. 7 shows a still further embodiment of a semiconductor device, wherein

FIG. 8 shows a still further embodiment of a semiconductor device, wherein

FIG. 9 shows a still further embodiment of a semiconductor device, wherein

FIG. 10 shows a still further embodiment of a semiconductor device, wherein

PREFERRED EMBODIMENTS OF THE INVENTION

Now, the present invention is more specifically described with reference to accompanying drawings.
Embodiment 1

Figure 4A:
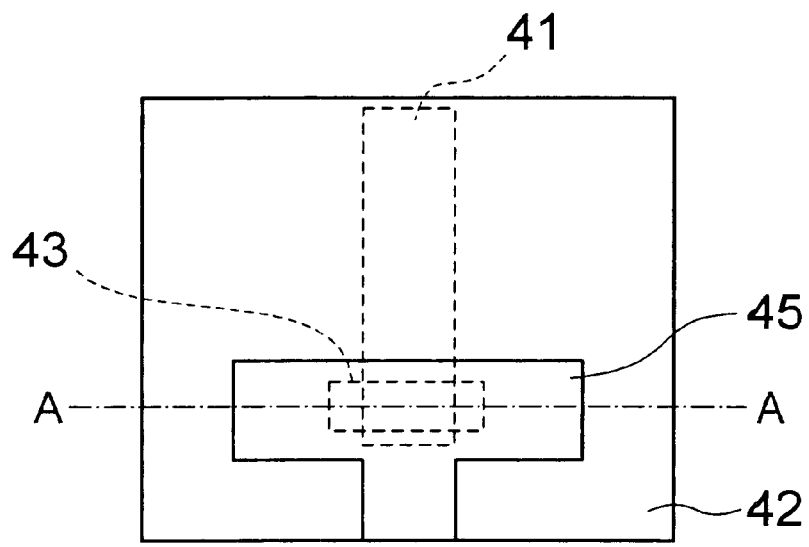
FIG. 4A is a top, plan view thereof
Figure 4B:
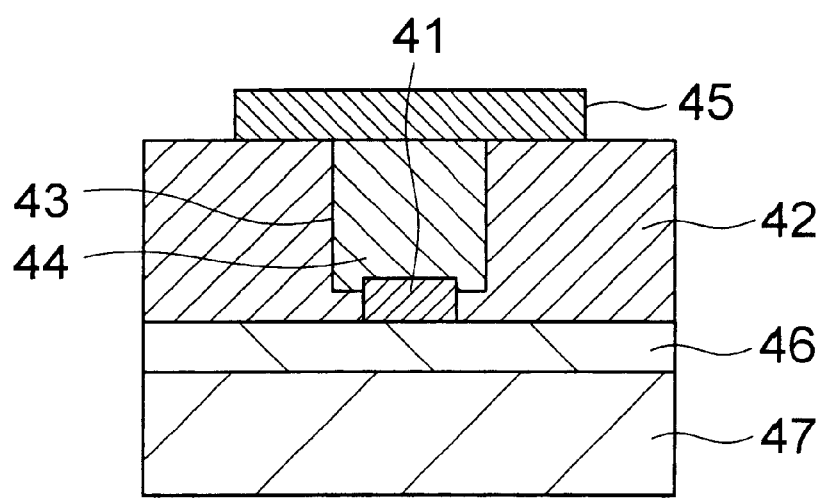
FIG. 4B is a sectional view of the structure of FIG. 4A taken along a line A—A.

As shown in FIG. 4B, a silicon oxide film 46 is formed on a semiconductor substrate 47 and a first layer conductor 41 is formed on the central part of the silicon oxide film 46. When the first layer conductor 41 is a wiring, the wiring can be made of aluminum, an aluminum alloy or copper. The wiring can be provided with a barrier metal layer made of a high melting point metal such as titanium, tantalum, molybdenum and tungsten which may be present on the top and bottom of the aluminum, the aluminum alloy or the like. When the first layer conductor is an element such as a resistor, the element can be formed by polycrystalline silicon.

Then, a dielectric film 42 is formed on and around the first layer conductor 41 and on the silicon oxide film 46, and the dielectric film 42 is flattened by employing a CMP technique followed by perforation of a via hole 43 through the dielectric film 42. At this time, a part of the aperture of the via hole 43 is always overlapped with the first layer conductor 41, and an aperture width is larger than a width of the first layer conductor 41.

In the embodiment of FIG. 4, the circumference of the aperture of the via hole 43 exists outside of the both sides of the first layer conductor 41. A conductive material 44 such as tungsten is grown on the entire surface of the dielectric film 42 including the inner wall of the via hole 43 by employing a CVD technique, and the conductive material 44 in the via plug 43 is flattened with regard to the dielectric film 42 to fill the via hole 43 with the conductive material 44. A second layer conductor 45 is formed in order to completely cover the via plug 43. Unnecessary trenches are not formed in the via plug 43 because the complete covering of the via plug 43 with the second layer conductor 45 is secured.

The contact areas between the first layer conductor 41, 11 and the conductive material 44, 14 in the via hole 43, 18 of the present embodiment of FIG. 4 and of the conventional example of FIG. 1 are compared with each other. In FIG. 1, the width of the first layer conductor 11 is made to be 0.8 micronmeter, and the aperture of the via hole has a rectangular shape having a width of 0.5 micronmeter. In FIG. 4, the width of the first layer conductor 11 is made to be 0.8 micronmeter, and the aperture of the via hole 43 of FIG. 4 is formed by extending the aperture of FIG. 1 in the horizontal direction to make its width larger than that of the first layer conductor 41 by 0.5 micronmeter. Under these circumstances, the contact area between the first layer conductor 41 and the conductive material 44 in the via hole 43 in the embodiment of FIG. 4 is 1.6 times larger than that of the conventional example of FIG. 1. When the aforementioned barrier metal layer is formed in the via hole by means of sputtering, the barrier metal layer having a desired thickness can be formed at the bottom surface of the via hole by employing the above wider aperture.

When the thicknesses of the first layer conductor 41 and of the dielectric film 42 are made to be 300 nm and 1000 nm, respectively, the side surface of the first layer conductor 41 and the bottom surface of the via hole are in contact with each other by making a distance from the upper surface of the dielectric film 42 to the bottom of the via hole to 800 nm. Thereby, the contact area between the conductive material 44 filled in the via hole 43 and the first layer conductor 41 is made to be still larger.
Embodiment 2

Figure 5A:
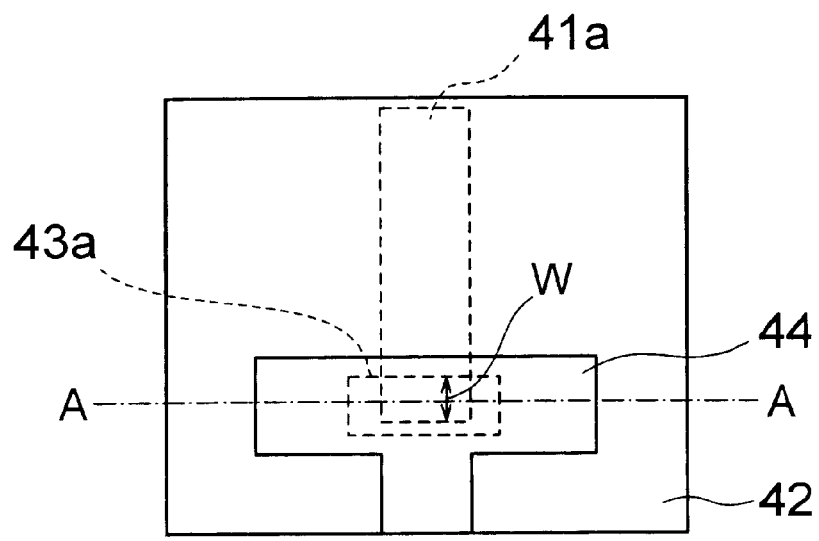
FIG. 5A is a top plan view thereof and FIG. 5B is a sectional view of the structure of FIG. 5A taken along a line A—A.
Figure 5B:
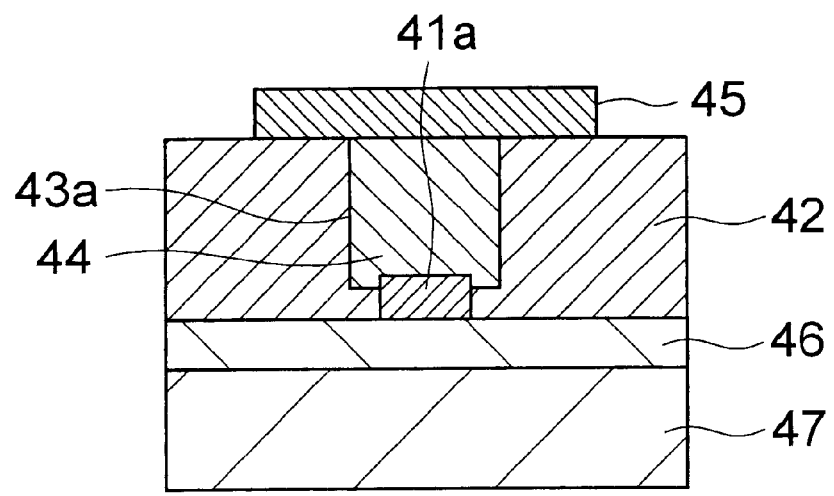

FIGS. 5A and 5B show another embodiment of the present invention. Since Embodiments 2 to 7 are modifications of the above Embodiment 1, the description of the same elements as those of Embodiment 1 will be omitted by affixing the same numerals thereto.

In this embodiment, the circumference of the aperture of a via hole 43a exists outside of three sides of a first layer conductor 41a, and Embodiment 2 differs from Embodiment 1 in this aspect.

Figure 1A:
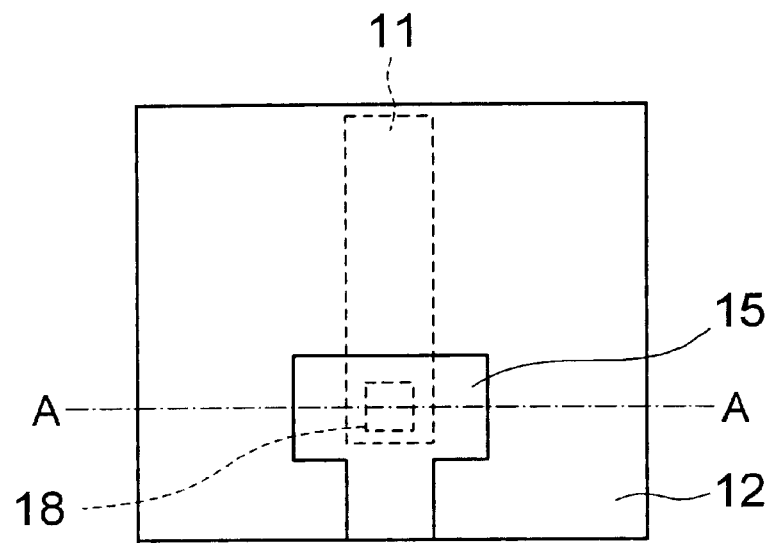
FIG. 1A is a top plan view thereof and FIG. 1B is a sectional view of the structure of FIG. 1A taken along a line A—A.
Figure 1B:
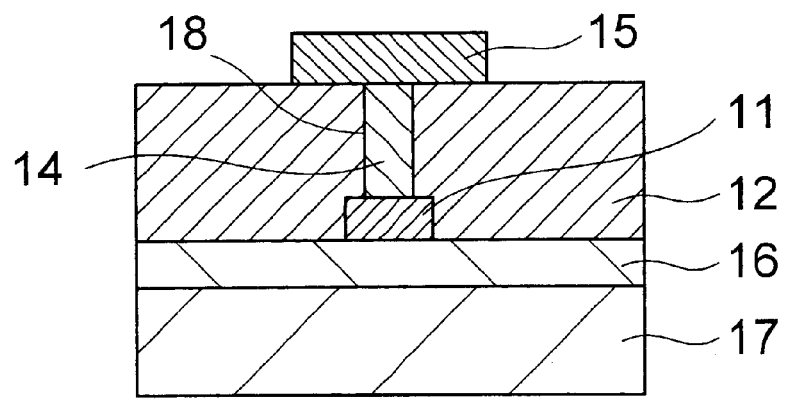

When the sizes of the first layer conductor 41a and of the aperture of via holes 43a are the same as those of Embodiment 1 of FIGS. 4A and 4B, the contact area between the first layer conductor 41a and the conductive material 44 can be made larger than that of the conventional example shown in FIGS. 1A and 1B by making a length ("w" in FIG. 5A) of an area formed by overlapping between the first layer conductor 41a and the via hole 43a to 0.32 micronmeter or more. The contact area between the first layer conductor 41a and the conductive material 44 can be made larger than that of Embodiment 1 of FIGS. 4A and 4B 10 by making the length "w" to 0.5 micronmeter or more.

Since the overlapping between the first layer conductor 41a and the via hole 43a in Embodiment 2 can be performed more freely compared with Embodiment 1, the accuracy of the position adjustment between the mask for forming the via hole and the first layer conductor can be moderated.

Embodiment 3

Figure 6A:
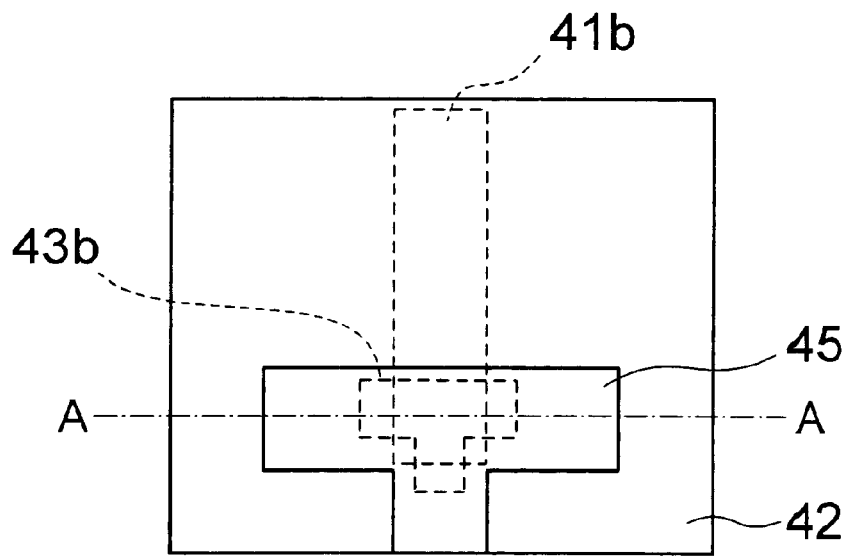
FIG. 6A is a top plan view thereof and FIG. 6B is a sectional view of the structure of FIG. 6A taken along a line A—A.
Figure 6B:
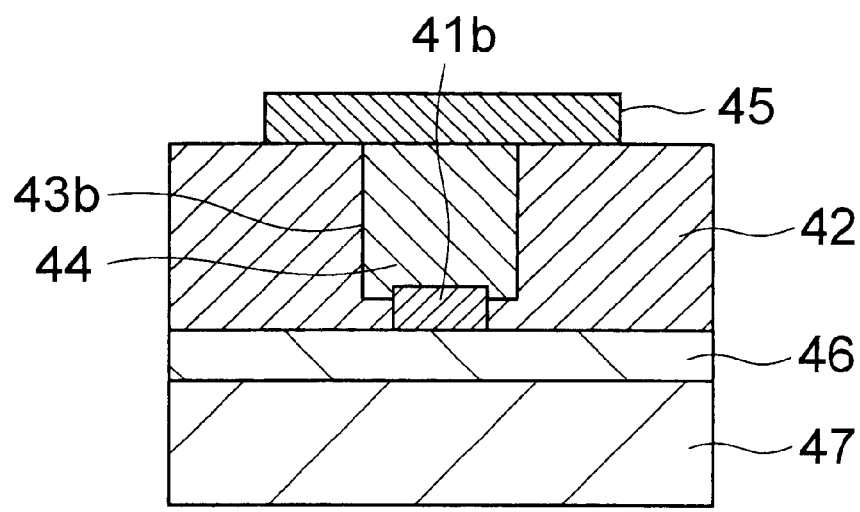

FIGS. 6A and 6B show a further embodiment in which the circumference of the aperture of a via hole 43b exists outside of three sides of a first layer conductor 41b, and the via hole 43b is formed in T-shaped.

Also in Embodiment 3, the aperture area is larger than that of the via hole 18. of the conventional example of FIG. 1A so that the contact area between the first layer conductor 41b and the conductive material 44 in the via hole 43b can be made larger. The aperture shape of the via hole can be formed more freely in Embodiment 3 than in Embodiment 1.

Embodiment 4

Figure 7A:
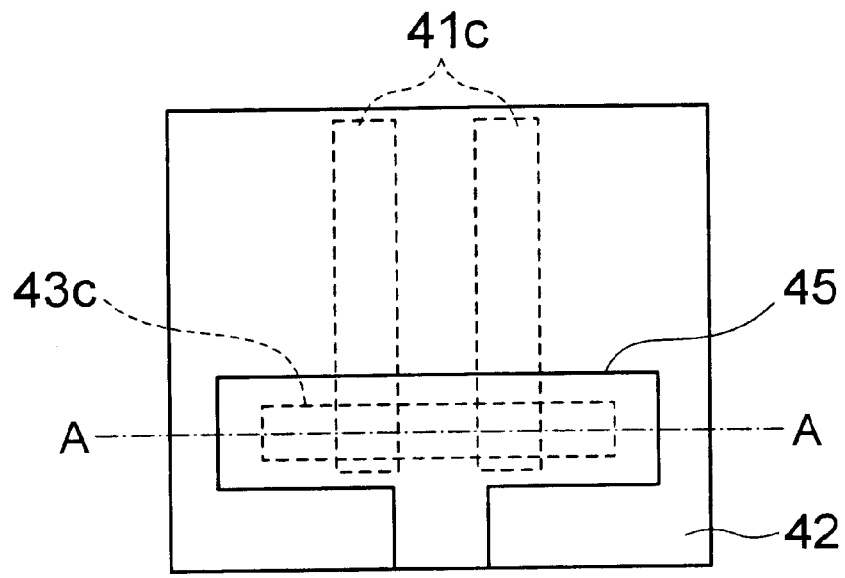
FIG. 7A is a top plan view thereof and FIG. 7B is a sectional view of the structure of FIG. 7A taken along a line A—A.
Figure 7B:
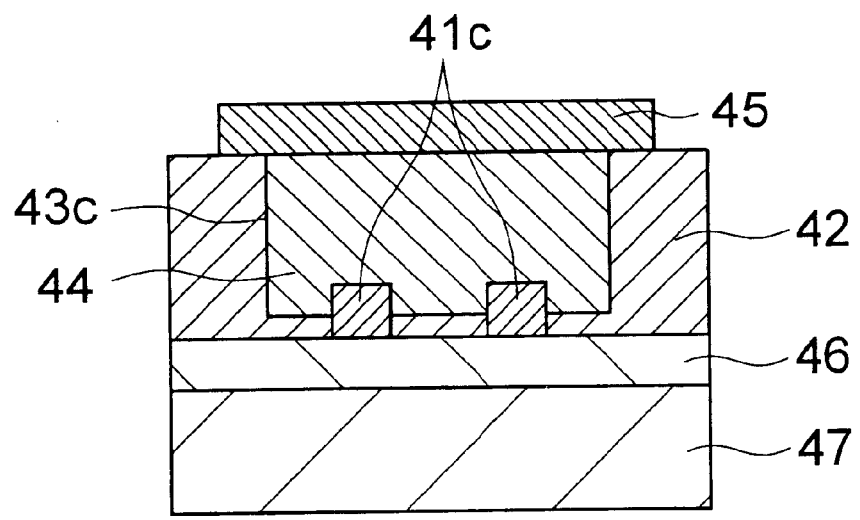

FIGS. 7A and 7B show a still farther embodiment in which two patterns of first layer conductors 41c are formed adjacent to each other. When the two first layer conductors 41c are formed as shown in FIGS. 7A and 7B, a single via hole 43c which extends over the two first layer conductors 41c is perforated in the dielectric film 42. Further, the circumference of the aperture of the via hole 43c exists outside of the ends of the two first layer conductors 41c. After the via hole 43c is filled with the conductive material 44, the second layer conductor 45 is formed to entirely cover the via plug 43c.

Embodiment 5

Figure 8A:
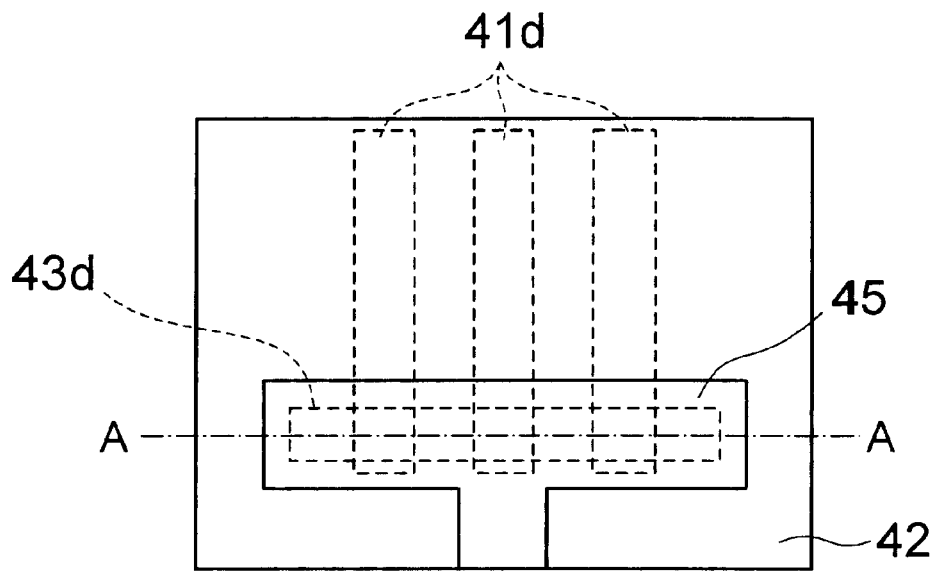
FIG. 8A is a top plan view thereof and FIG. 8B is a sectional view of the structure of FIG. 8A taken along a line A—A.
Figure 8B:
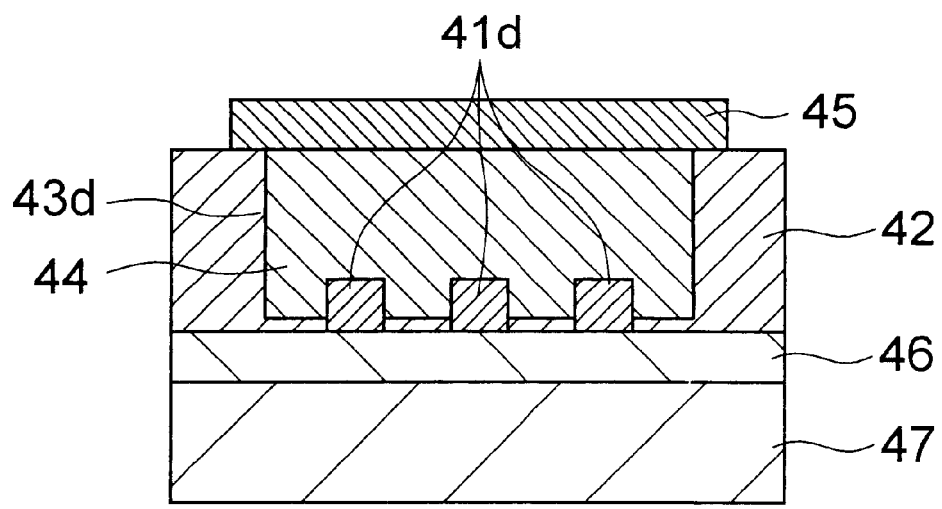

FIGS. 8A and 8B show a still further embodiment in which three patterns of first layer conductors 41d are formed adjacent to one another. Also in Embodiment 5, a single via hole 43d which extends over the three first layer conductors 41d is perforated in the dielectric film 42. The circumference of the aperture of the via hole 43d exists outside of the ends of the first layer conductors 41d. After the via hole 48d is filled with the conductive material 44, the second layer conductor 45 is formed to entirely cover the via plug 43d.

Figure 2A:
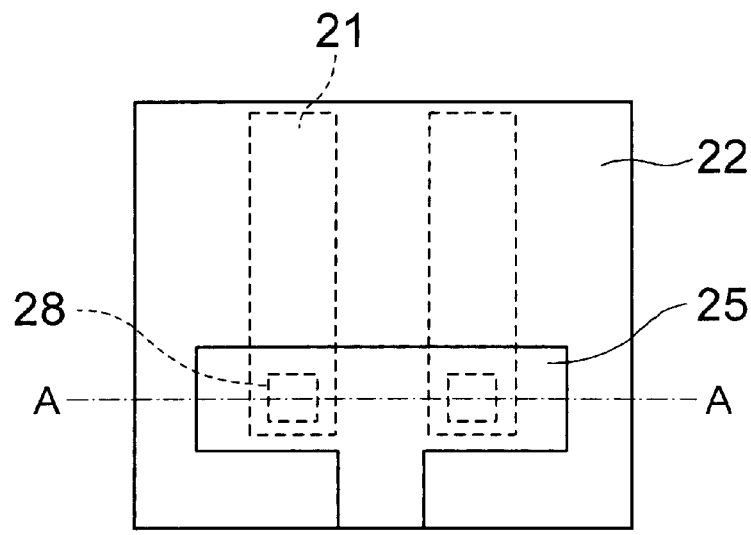
FIG. 2A is a top plan view thereof and FIG. 2B is a sectional view of the structure of FIG. 2A taken along a line A—A.
Figure 2B:
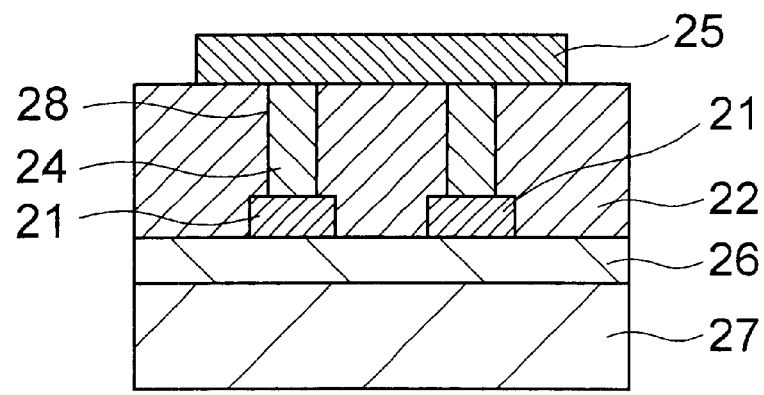
Figure 3A:
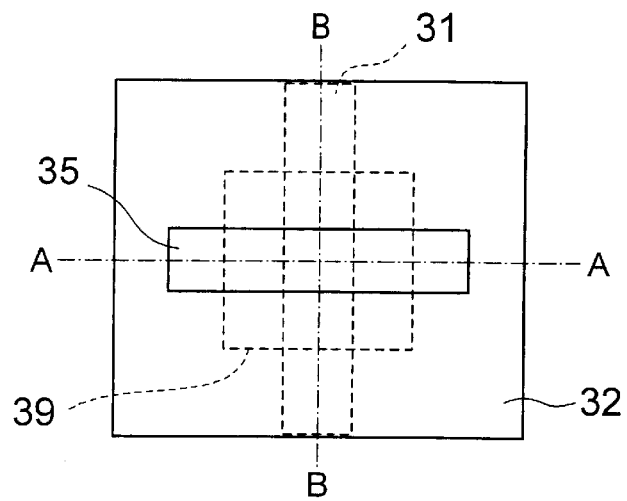
FIG. 3A is a top plan view thereof and FIGS. 3B and 3C are sectional views of the structures of FIG. 3A taken along lines A—A and B—B, respectively.
Figure 3B:
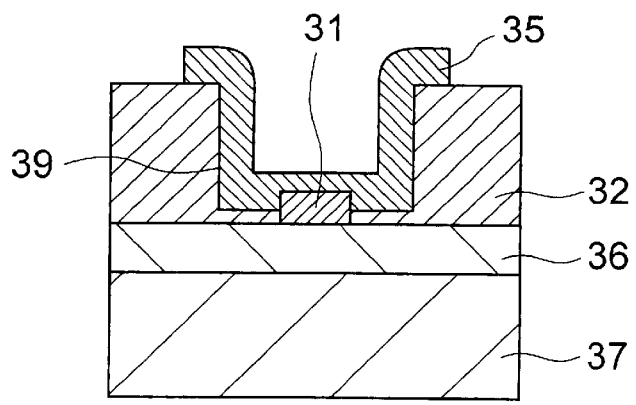
Figure 3C:
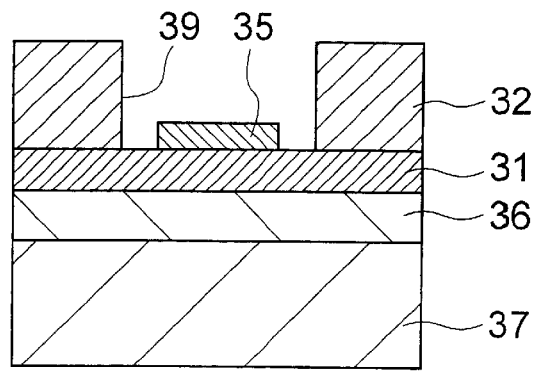

When two or more first layer conductors are present, the same number of via holes as that of first layer conductors must be perforated in the conventional example, as shown in FIG. 2. Since, however, the first layer conductors and the second layer conductor can be connected by perforating a single via hole in Embodiments 4 and 5 to make the aperture area of the via hole larger than those of the conventional example and of the preceding embodiments, the barrier metal layer having a desired thickness can be formed more uniformly at the bottom surface of the via hole.

Embodiment 6

Figure 9A:
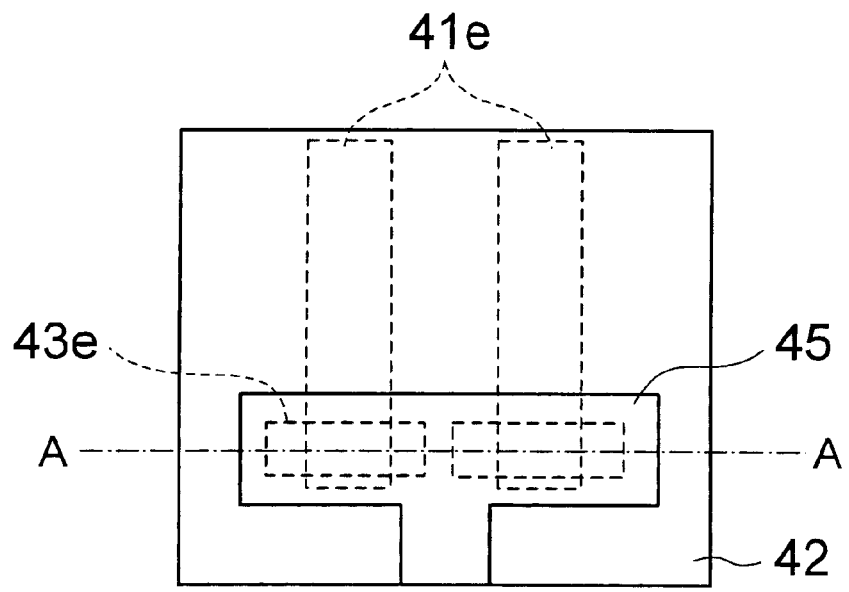
FIG. 9A is a top plan view thereof and FIG. 9B is a sectional view of the structure of FIG. 9A taken along a line A—A.
Figure 9B:
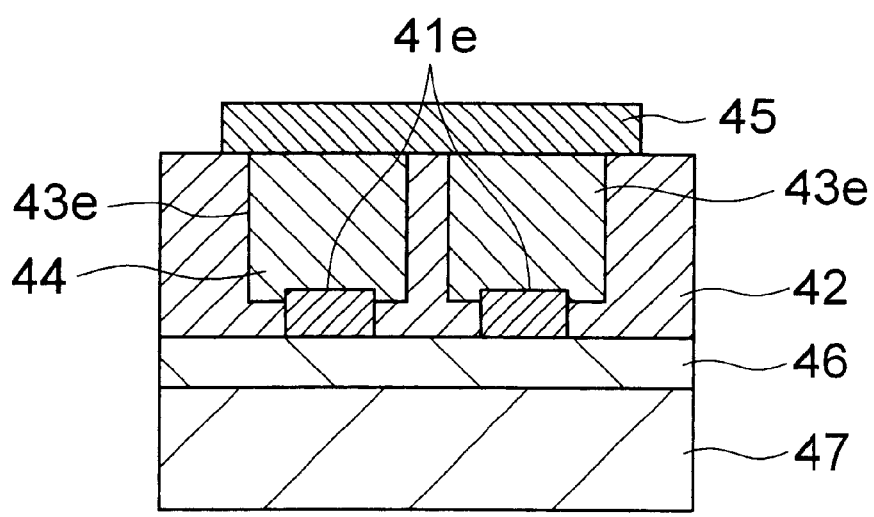

FIGS. 9A and 9B show a still further embodiment in which two patterns of first layer conductors 41e are formed adjacent to each other and two via holes 43e are perforated for the respective first layer conductors 41e. The second layer conductor 45 is formed to entirely cover the two via plugs 43e.

Embodiment 7

Figure 10A:
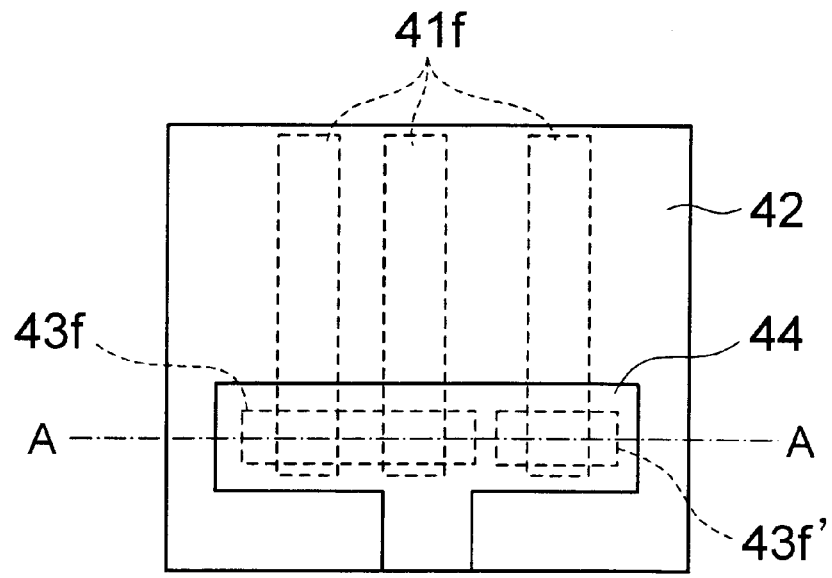
FIG. 10A is a top plan view thereof and FIG. 10B is a sectional view of the structure of FIG. 10A taken along a line A—A.
Figure 10B:
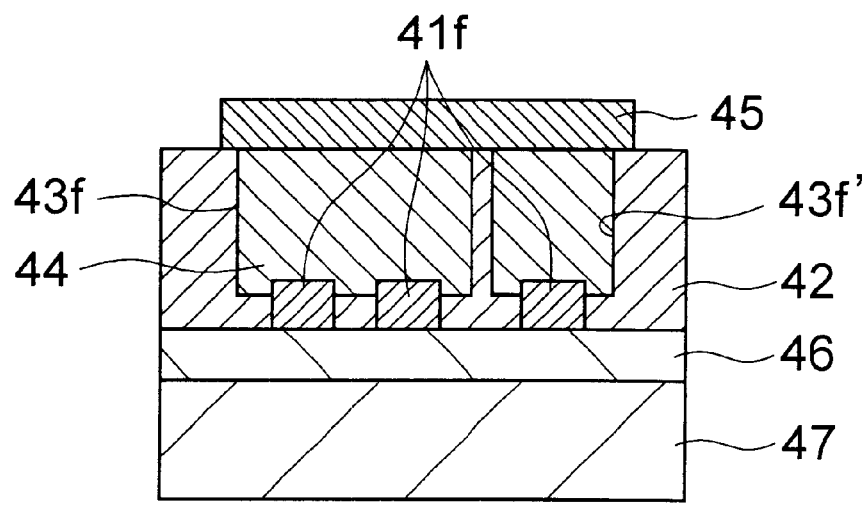

FIGS. 10A and 10B show a still further embodiment in which three patterns of first layer conductors 41f are formed adjacent to one another and first and second via holes 43f, 43f are perforated for the three first layer conductors 41f. The first via hole 43f is formed, similarly to the via hole shown in FIG. 7B, for the two adjacent first layer conductors 41f among the three, and the second via hole 43f' is formed, similarly to the via hole shown in FIG. 4B, for the remaining first layer conductor 41f. The second layer conductor 45 is formed to entirely cover the two via holes 43f, 43f'.

In the present invention, as shown in Embodiments 6 and 7, suitable via holes are selected and combined among the different via holes shown in FIGS. 4 to 8. When a distance between first layer conductors is large or an abundance of patterns of first layer conductors are positioned adjacent to one another, an aperture width of a via hole becomes long as shown in the embodiments of FIGS. 7 and 8. When a resist film ordinarily employed for pattern formation is used for forming a large pattern, the pattern to be formed is stretched due to contraction of the resist film. When, accordingly, a via hole having an excessively long aperture width is formed, a pattern for forming the via hole becomes too large due to the contraction of the resist film. However, as shown in FIGS. 9 and 10, the influence due to the contraction of the resist film may be controlled by combining several via holes.

Although the bottoms of all the via holes 43 to 43f in FIGS. 4 to 10 are in contact with the side surfaces and the top surfaces of the first layer conductors 41 to 41f, the via holes may be so formed that the bottoms are in contact with only the top surfaces of the first layer conductors.

Since the above embodiments are described only as examples, the present invention is not limited to the above embodiments and various modifications or alternations can be easily made therefrom by those skilled in the art without departing from the scope of the present invention.

What is claimed is:

1. A semiconductor device comprising:

a substrate, a first dielectric film overlying said substrate, a first layer conductor formed on said first dielectric film, a second dielectric film formed on said first dielectric film and on said first layer conductor, a second layer conductor formed on said second dielectric film, said first layer conductor and said second layer conductor being electrically connected through at least one via hole formed in said second dielectric film, said via hole having a width larger than that of the first layer conductor and not larger than that of the second layer conductor, and a via plug filling said via hole and being entirely covered with said second layer conductor, wherein two or more first layer conductors are located adjacent to one another and formed on said first dielectric film, and said via hole extends over all the first layer conductors.

2. The semiconductor device as defined in claim 1, wherein said via hole has a circumference which extends to outside of edges of the outermost two first layer conductors.

3. A semiconductor device comprising:

a substrate, a first dielectric film formed on said substrate, three or more first layer conductors located adjacent to one another and formed on said first dielectric film, a second dielectric film formed on said first dielectric film and on said first layer conductors, a second layer conductor formed on said second dielectric film, said first layer conductors and said second layer conductor being electrically connected through at least two via holes formed in said second dielectric film, a first via hole among at least the two via holes having an aperture overlapped with at least a part of one of the three or more first layer conductors and an aperture width larger than that of the one of the three or more first layer conductors, a second via hole among at least the two via holes having an aperture extending over two or more first layer conductors, and via plugs filling said via holes and being entirely covered with said second layer conductor.

4. The semiconductor device as defined in claim 3, wherein said first via hole has a circumference which extends to outside of three sides of said first layer conductor.

5. The semiconductor device as defined in claim 3, wherein said second via hole has a circumference which extends to outside of edges of the outermost two first layer conductors.

6. The semiconductor device as defined in claim 3, wherein a bottom of a via hole is in contact with a side surface of the first layer conductor.

* * * * *